(12) United States Patent
Hahn et al.

(10) Patent No.: US 7,737,435 B2
(45) Date of Patent: Jun. 15, 2010

(54) ORGANIC SEMICONDUCTOR COMPOSITION COMPRISING OLIGOMER COMPOUNDS, COMPOSITION FOR PATTERNING ORGANIC SEMICONDUCTOR LAYER COMPRISING THE SAME, ORGANIC SEMICONDUCTOR THIN FILM USING THE SAME AND ORGANIC ELECTRONIC DEVICE EMPLOYING THE THIN FILM

(75) Inventors: Jung Seok Hahn, Yongin-si (KR);
Tae-Sang Kim, Yongin-si (KR);
Bang-Lin Lee, Yongin-si (KR);
Sang-Yoon Lee, Yongin-si (KR); Eun Kyung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 447 days.

(21) Appl. No.: 11/706,985

(22) Filed: Feb. 16, 2007

(65) Prior Publication Data
US 2008/0076872 A1 Mar. 27, 2008

(30) Foreign Application Priority Data
Sep. 21, 2006 (KR) .................... 10-2006-0091653

(51) Int. Cl.
*H01L 51/30* (2006.01)
(52) U.S. Cl. ............ 257/40; 257/E51.03; 257/E51.031; 257/E51.036
(58) Field of Classification Search .................. 257/40, 257/E51.027–E51.037
See application file for complete search history.

(56) References Cited

OTHER PUBLICATIONS

Ridolfi et al., Influence of the solvent on the aggregation of a poly(3-hexylthiophene)—quinquethiophene-S,S-dioxide blend at surfaces: an SFM study, J. Mater. Chem., 2005, 15, 1704-1707.*
Brown et al., WO 2005/055248 A2.*

* cited by examiner

*Primary Examiner*—Anh Phung
*Assistant Examiner*—Michael Lulis
(74) *Attorney, Agent, or Firm*—Harness, Dickey & Pierce, P.L.C.

(57) ABSTRACT

Example embodiments pertain to an organic semiconductor composition, in which low-molecular-weight oligomer compounds are distributed in the spaces of a polymer compound so that the free spaces of the organic semiconductor polymer compound are filled with the low-molecular-weight oligomer compounds upon the formation of an organic semiconductor thin film, thereby increasing π-π stacking effects, and to an organic semiconductor thin film using the same and an organic electronic device employing the thin film. Using the organic semiconductor composition according to example embodiments, a semiconductor thin film and an organic electronic device having improved electrical properties may be manufactured.

14 Claims, 2 Drawing Sheets

ORGANIC SEMICONDUCTOR COMPOSITION COMPRISING OLIGOMER COMPOUNDS, COMPOSITION FOR PATTERNING ORGANIC SEMICONDUCTOR LAYER COMPRISING THE SAME, ORGANIC SEMICONDUCTOR THIN FILM USING THE SAME AND ORGANIC ELECTRONIC DEVICE EMPLOYING THE THIN FILM

PRIORITY STATEMENT

This non-provisional application claims priority under 35 U.S.C. §119 to Korean Patent Application No. 10-2006-0091653, filed on Sep. 21, 2006, in the Korean Intellectual Property Office (KIPO), the entire contents of which are herein incorporated by reference.

BACKGROUND

1. Field

Example embodiments relate to an organic semiconductor composition comprising oligomer compounds, a composition for patterning an organic semiconductor layer comprising the same, an organic semiconductor thin film using the same, and an organic electronic device employing the thin film. Other example embodiments relate to an organic semiconductor composition, in which low-molecular-weight oligomer compounds are distributed in the spaces of a polymer compound so that the free spaces of the organic semiconductor polymer compound are filled with the low-molecular-weight oligomer compounds upon the formation of an organic semiconductor thin film, thereby increasing $\pi$-$\pi$ stacking effects, and to an organic semiconductor thin film using the same and an organic electronic device comprising the thin film.

2. Description of the Related Art

Because the development of polyacetylene, which is a conjugated organic polymer having semiconductor properties, organic semiconductors have been receiving attention as electrical and electronic material thanks to the advantages of organic material, for example, various synthesis methods, relatively easy formability into fibers or films, flexibility, conductivity, and decreased preparation costs, and thus have been intensively and extensively studied in the broad field of functional electronic devices and optical devices. Among devices using such a conductive polymer, research into organic thin film transistors (OTFTs), including a semiconductor layer formed of organic material is being conducted all over the world these days.

Compared to conventional silicon thin film transistors, OTFTs may be advantageous because it is possible to form a semiconductor layer through a solution process, in place of plasma-enhanced chemical vapor deposition (PECVD), and all of the fabrication processes may be carried out using a roll-to-roll process on a plastic substrate, if necessary, thus decreasing the cost of fabricating the transistor. Accordingly, the OTFT may be variously applicable to devices for driving active displays, smart cards and/or plastic chips for inventory tags.

However, where a solution process is adopted to form the thin film of the OTFT, the process may suffer because intermolecular ordering is random, and thus, a highly ordered thin film may be difficult to obtain, undesirably decreasing charge mobility and increasing the cut-off leakage current, therefore entailing difficulties in application to actual devices.

With the goal of solving such problems, methods of treating an insulator with a surface treating agent compatible with a semiconductor material have been mainly used, but may be disadvantageous because the manufacturing cost is increased by the use of additional material, the manufacturing process is complicated, and desired effects are not sufficiently achieved. Thus, there is an urgent need for the development of an organic semiconductor composition capable of being subjected to a solution process and increasing intermolecular $\pi$-$\pi$ stacking effects to thus improve the properties of organic electronic devices.

SUMMARY

Accordingly, example embodiments have been made keeping in mind the above problems occurring in the related art, and example embodiments provide an organic semiconductor composition capable of being subjected to a solution process and increasing intermolecular $\pi$-$\pi$ stacking effects to thus improve the properties of organic electronic devices.

Example embodiments provide a composition for patterning an organic semiconductor layer, including the organic semiconductor composition in order to form a highly ordered organic semiconductor thin film. Example embodiments provide an organic semiconductor thin film, which is formed using the composition to thus increase intermolecular ordering and packing density, leading to increased charge mobility, and an organic electronic device including the thin film.

Example embodiments provide an organic semiconductor composition, comprising a polymer compound represented by Formula 1 below and one or more oligomer compounds selected from the group consisting of compounds represented by Formulas 2 to 4 below:

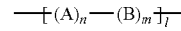

Formula 1 wherein A and B are each independently a substituted or unsubstituted $C_{6-30}$ aryl group or a substituted or unsubstituted $C_{2-30}$ heteroaryl group, and n and m are each independently an integer from about 0 to about 20 (n+m≠0), and l is an integer from about 10 to about 100,000; and $(A)_o$               Formula 2

$(B)_o$               Formula 3

$(A\text{-}B)_p$            Formula 4 in Formulas 2 to 4, A and B are each independently a substituted or unsubstituted $C_{6-30}$ aryl group or a substituted or unsubstituted $C_{2-30}$ heteroaryl group, o is an integer from about 4 to about 12, and p is an integer from about 2 to about 6.

Example embodiments also provide a composition for patterning an organic semiconductor layer, including the above-mentioned organic semiconductor composition and an organic solvent. In addition, example embodiments provide an organic semiconductor thin film formed using the above composition. In addition, example embodiments provide an organic electronic device including the organic semiconductor thin film.

BRIEF DESCRIPTION OF THE DRAWINGS

Example embodiments will be more clearly understood from the following detailed description taken in conjunction with the accompanying drawings.

FIG. 1 is a schematic view illustrating the distribution of oligomer compounds included in the channel layer of the OTFT formed using the organic semiconductor composition of example embodiments;

FIG. 2 is a schematic sectional view illustrating the bottom contact type OTFT, according to example embodiments;

FIG. 3 is a schematic sectional view illustrating the top contact type OTFT, according to example embodiments; and FIG. 4 is a graph illustrating the current transfer curve of the OTFTs manufactured in Examples 1 and 2 and Comparative example.

Figure 1:
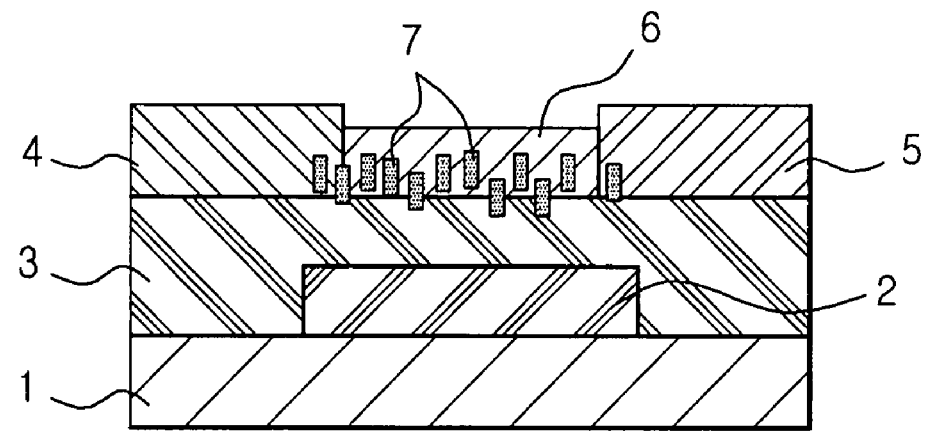
FIGS. 1-4 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the appended drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, there is provided an organic semiconductor composition, including a polymer compound represented by Formula 1 below and one or more oligomer compounds selected from the group consisting of compounds represented by Formulas 2 to 4 below:

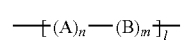

Formula 1 wherein A and B are each independently a substituted or unsubstituted $C_{6-30}$ aryl group or a substituted or unsubstituted $C_{2-30}$ heteroaryl group, and n and m are each independently an integer from about 0 to about 20 (n+m≠0), and l is an integer from about 10 to about 100,000;

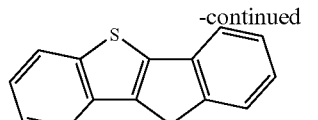

Formula 2

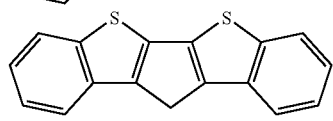

Formula 3

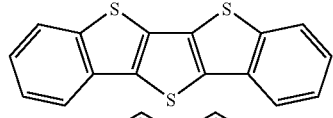

Formula 4

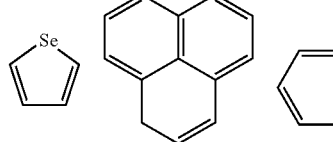

in Formulas 2 to 4, A and B are each independently a substituted or unsubstituted $C_{6-30}$ aryl group or a substituted or unsubstituted $C_{2-30}$ heteroaryl group, and o is an integer from about 4 to about 12, and p is an integer from about 2 to about 6.

As such, although the substituent in the substituted aryl group or heteroaryl group is not particularly limited, it may include one or more selected from the group consisting of hydrogen, a hydroxyl group, halogen, a $C_{1-30}$ alkyl group, a $C_{6-30}$ aryl group, a $C_{2-30}$ heteroaryl group, a hydroxyalkyl group, a nitro group, a cyano group, a $C_{1-30}$ alkenyl group, a $C_{1-30}$ alkynyl group, a $C_{1-30}$ alkoxy group, a $C_{1-30}$ alkoxyalkyl group, a $C_{6-30}$ arylalkyl group, and a $C_{5-30}$ cycloalkyl group.

Specifically, in Formulas 1 to 4, the aryl group or heteroaryl group may be selected from the group consisting of compounds represented by Formulas 5 and 6 below, and may be thiophene, phenyl, pyrrole, pyridine, pyrimidine or pyrimidopyrimidine:

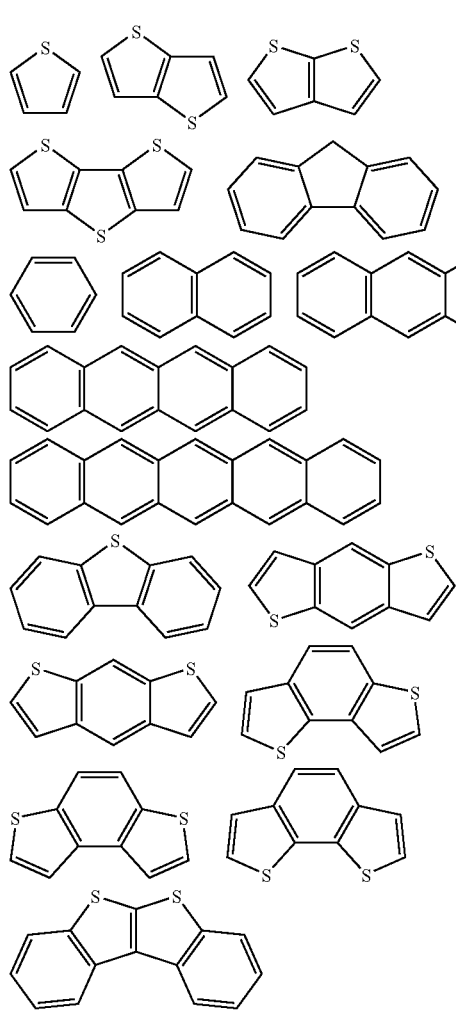

Formula 5

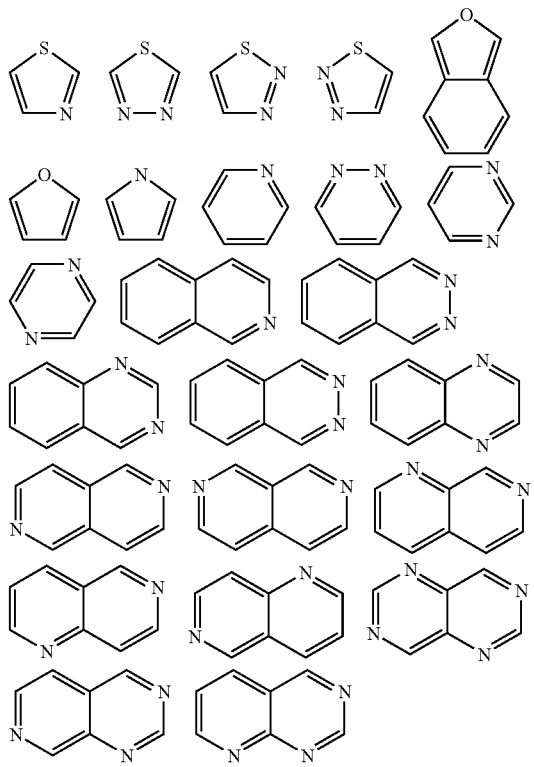

Formula 6

In example embodiments, as the polymer compound represented by Formula 1, a compound having a weight average molecular weight (MW) from about 100 to about 1,000,000 is used, and may be exemplified by a π-conjugated copolymer, specific examples of which may include polypyrrole, polythiophene, polyselenophene, polyisothianaphthene, poly (arylene vinylene), polyaniline, polyazulene, polypyrene, polycarbazole, polyfuran, polyphenylene, polyindole, polypyridazine, polyacene, and derivatives thereof.

For example, the organic semiconductor composition of example embodiments may include the polymer compound and the low-molecular-weight oligomer compounds, in which the oligomer compounds represented by Formulas 2 to 4 are distributed in the spaces of the polymer compound represented by Formula 1 so that the free spaces of the organic semiconductor polymer compound are filled with the low-molecular-weight oligomer compounds upon the formation of the organic semiconductor thin film, thereby increasing π-π stacking effects. Ultimately, the properties of the organic electronic device, e.g., an OTFT, may be improved.

FIG. 1 illustrates the distribution of the oligomer compounds included in the channel layer of the OTFT formed using the organic semiconductor composition of example embodiments. As illustrated in FIG. 1, oligomer compounds 7 may be distributed in the spaces of a semiconductor polymer compound within a semiconductor layer 6 of a channel layer, thus increasing intermolecular π-π stacking effects. The OTFT of example embodiments may also include a gate electrode 2, a gate insulating layer 3, source/drain electrodes 4,5, and a semiconductor layer 6, which are sequentially formed on a substrate 1.

Therefore, when the organic semiconductor composition of example embodiments is applied to an organic electronic device, e.g., an OTFT and/or a field emission device, a semiconductor thin film, exhibiting improved electrical properties, e.g., increased charge mobility, due to the increase in intermolecular ordering and packing density, may be formed. Further, upon a solution process using a polymer solution, because the low-molecular-weight oligomer compound, having solubility relatively higher than that of the polymer compound, is added, the amount of polymer compound used may be decreased or the absolute solute amount may be increased, leading to improved solubility.

The oligomer compound represented by Formulas 2 to 4, which is an oligomer compound of a monomer used in the preparation of the polymer compound represented by Formula 1, has both terminal ends terminated with appropriate end groups and thus may be efficiently dissolved in the polymer solution, for example, an oligomer compound having a weight average molecular weight (MW) from about 50 to about 1,000.

In the organic semiconductor composition of example embodiments, the molar ratio of the polymer compound represented by Formula 1 and the oligomer compound selected from the group consisting of the compounds represented by Formulas 2 to 4 may range from about 1000:1 to about 1:1000, for example, about 100:1 to about 10:1. This is because it is relatively easy to exhibit dielectric or metallic properties when mixing a very small amount of oligomer compound with the polymer compound of Formula 1, almost all examples of which manifest semiconductor properties.

The polymer compound of Formula 1 and the oligomer compounds of Formulas 2 to 4, contained in the organic semiconductor composition of example embodiments, may be synthesized through a typical process, but example embodiments may not be limited thereto. In addition, example embodiments provide a composition for patterning a semiconductor layer, including the organic semiconductor composition and an organic solvent.

As the organic solvent, a typical organic solvent may be used without particular limitation, and examples thereof may include alcohols, including methylalcohol, ethylalcohol, n-propyl alcohol, isopropyl alcohol, n-butyl alcohol, sec-butyl alcohol, t-butyl alcohol, isobutyl alcohol, and diacetone alcohol, ketones, including acetone, methylethylketone, and methylisobutylketone, glycols, including ethyleneglycol, diethyleneglycol, triethyleneglycol, propyleneglycol, butyleneglycol, hexyleneglycol, 1,3-propanediol, 1,4-butanediol, 1,2,4-butanetriol, 1,5-pentanediol, 1,2-hexanediol, and 1,6-hexanediol, glycol ethers, including ethyleneglycol monomethyl ether and triethyleneglycol monoethyl ether, glycol ether acetates, including propyleneglycol monomethyl ether acetate (PGMEA), acetates, including ethyl acetate, butoxyethoxy ethyl acetate, butyl carbitol acetate (BCA), and dihydroterpineol acetate (DHTA), terpineols, trimethyl pentanediol monoisobutyrate (TEXANOL), dichloroethene (DCE), chlorobenzene, and N-methyl-2-pyrrolidone (NMP), which may be used alone or in combinations of two or more.

The component ratio of the composition may be appropriately determined according to the choice of those skilled in the art, depending on the need. In terms of the solubility of the organic semiconductor composition, the composition for patterning a semiconductor layer may include about 0.1 wt %~about 10 wt % of the organic semiconductor composition and about 90 wt %~about 99.9 wt % of the organic solvent, for example, about 0.5 wt %~about 4 wt % of the organic semiconductor composition and about 96 wt %~about 99.5 wt % of the organic solvent.

Further, in order to increase the solubility and storability of the organic semiconductor composition, one or more additives selected from among an organic binder, a photosensitive monomer, a photoinitiator, a viscosity controller, a storage stabilizer, and a wetting agent may be further added, according to the judgment of those skilled in the art, within a range that does not inhibit the purpose of example embodiments. As the additive, e.g., an organic binder, a typical material known in the field of conventional organic electronic devices may be used without limitation.

In addition, example embodiments provide an organic semiconductor thin film formed using the composition for patterning a semiconductor layer. As such, the thin film may be formed by applying the composition for patterning a semiconductor layer on a substrate. The substrate is not particularly limited within a range that does not inhibit the purpose of example embodiments, and examples thereof may include a glass substrate, a silicon wafer, ITO glass, quartz, a silica substrate, an alumina substrate, and a plastic substrate, e.g., polyethylene naphthalate, polyethylene terephthalate, polycarbonate, polyvinylalcohol, polyacrylate, polyimide, polynorbornene, and polyethersulfone, which may be appropriately used according to the choice of those skilled in the art.

As the coating process, a typical solution process may be used without limitation, and examples thereof may include spin coating, dip coating, roll coating, screen coating, spray coating, spin casting, flow coating, screen printing, ink jetting, and drop casting. For convenience and uniformity, spin coating or ink jetting may be used. Upon spin coating, the spinning rate may be maintained at an appropriate level within the range from about 100 rpm to about 10,000 rpm. The organic semiconductor thin film of example embodiments has a thickness from about 300 Å to about 2,000 Å.

Because the organic semiconductor thin film according to example embodiments is formed using the organic semiconductor composition, it may be possible to perform a solution process and intermolecular π-π stacking effects may be increased by the distribution of the oligomer compounds in the free spaces of the polymer compound, desirably increasing intermolecular ordering and packing density, resulting in improved electrical properties satisfying increased charge mobility. Therefore, the organic semiconductor thin film of example embodiments may be effectively applied to various organic electronic devices.

In addition, example embodiments provide an organic electronic device, including the organic semiconductor thin film as a semiconductor layer. Examples of the organic electronic device may include, but are not limited to, OTFTs, organic electroluminescent devices, solar cells, and polymer memory. As such, the organic semiconductor thin film may be applied to the above devices through a typical process known in the art.

As an example of the above-mentioned organic electronic devices, an OTFT may include a substrate, a gate electrode, a gate insulating layer, a semiconductor layer, and source/drain electrodes, the semiconductor layer including the organic semiconductor thin film formed from the organic semiconductor composition of example embodiments. The OTFT of example embodiments may have a bottom contact structure, a top contact structure, or a top gate structure, and the structure thereof may be modified within a range that does not inhibit the purpose of example embodiments.

Figure 2:
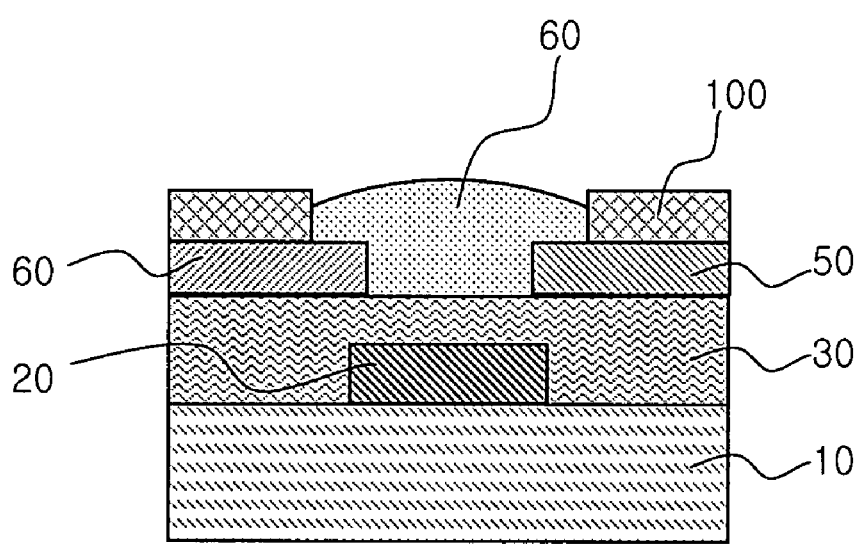
Figure 3:
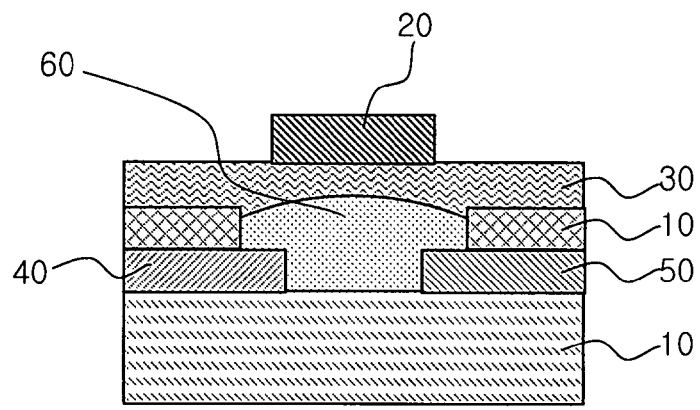

The examples of the structure of the OTFT of example embodiments are schematically illustrated in FIGS. 2 and 3. FIG. 2 is a schematic sectional view illustrating the bottom contact type OTFT, and FIG. 3 is a schematic sectional view illustrating the top contact type OTFT.

For example, as illustrated in FIG. 2, the OTFT of example embodiments may have a structure including a gate electrode 2, a gate insulating layer 3, source/drain electrodes 4,5, and a semiconductor layer 6, which are sequentially formed on a substrate 1, or, alternatively, the OTFT of example embodiments may have a structure including a gate electrode 2, a gate insulating layer 3, a semiconductor layer 6, and source/drain electrodes 4, 5, which are sequentially formed on a substrate 1, as illustrated in FIG. 3.

As the substrate 1 of the OTFT of example embodiments, any substrate may be used without limitation as long as it is known in the art, and specific examples thereof may include a glass substrate, a silica substrate, and a plastic substrate, e.g., polyethylene naphthalate, polyethylene terephthalate, polycarbonate, polyvinylalcohol, polyacrylate, polyimide, polynorbornene and/or polyethersulfone.

As the gate electrode 2 and the source/drain electrodes 4, 5, any metal may be used as long as it is known in the art, and specific examples thereof may include, but may not be limited to, gold (Au), silver (Ag), aluminum (Al), nickel (Ni), indium tin oxide (ITO) and/or molybdenum/tungsten (Mo/W). The gate electrode 2 and the source/drain electrodes 4, 5 may have a thickness from about 500 Å to about 2,000 Å, but example embodiments may not be limited thereto.

As the gate insulating layer 3, any insulator having a high dielectric constant may be used as long as it is known in the art. Specifically, a ferroelectric insulator selected from among $Ba_{0.33}Sr_{0.66}TiO_3$ (BST), $Al_2O_3$, $Ta_2O_5$, $La_2O_5$, $Y_2O_3$ and $TiO_2$, an inorganic insulator selected from among $PbZr_{0.33}Ti_{0.60}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$ and AlON, or an organic insulator selected from among polyimide, benzenecyclobutene (BCB), parylene, polyacrylate, polyvinyl alcohol, and polyvinyl phenol, may be used, but example embodiments may not be limited thereto. The thickness of the insulating layer may range from about 3,000 Å to about 1 μm.

A better understanding of example embodiments may be obtained in light of the following examples which are set forth to illustrate, but are not to be construed to limit example embodiments.

EXAMPLE 1

Manufacture of OTFT (1)

A poly(oligothiophene-thiozole) derivative (MW about 40000, polymerization degree 20) was dissolved to a concentration of about 1 wt % in chlorobenzene, and was then mixed with an oligomer compound (MW about 8000, polymerization degree 4) of the above material at a molar ratio of about 100:1, to thus form a composition for patterning a semiconductor layer.

Subsequently, on a washed plastic substrate, chromium for a gate electrode was formed to a thickness of about 1000 Å through sputtering, after which $SiO_2$ for a gate insulating layer was deposited on the gate electrode to a thickness of about 1000 Å through CVD. Thereafter, ITO for source/drain electrodes was deposited on the gate insulating layer to a thickness of about 1200 Å through sputtering.

Before deposition of the organic semiconductor material, the substrate washed with isopropylalcohol for about 10 min and dried. The sample was immersed in an about 10 nM octadecyltrichlorosilane solution diluted with hexane for about 30 sec, washed with acetone, and dried, after which the above composition was applied thereon to a thickness of about 800 Å through spin coating at about 1000 rpm and then baked at about 100° C. for about 1 hour in an argon atmosphere to thus form a semiconductor layer, thereby manufacturing the bottom contact type OTFT shown in FIG. 2.

EXAMPLE 2

Manufacture of OTFT (2)

An OTFT was manufactured in the same manner as in Example 1, with the exception that a composition including a polymer material and an oligomer compound at a molar ratio of about 10:1 was used as material for patterning a semiconductor layer.

COMPARATIVE EXAMPLE

An OTFT was manufactured in the same manner as in Example 1, with the exception that only the polymer material was used as material for patterning a semiconductor layer.

EXPERIMENTAL EXAMPLE

Evaluation of Properties of OTFT

In order to evaluate the electrical properties of OTFTs manufactured in Examples 1 and 2 and Comparative Example, current transfer properties were measured using a semiconductor analyzer (4200-SCS), available from KEITHLEY. The results are shown in FIG. 4.

Figure 4:
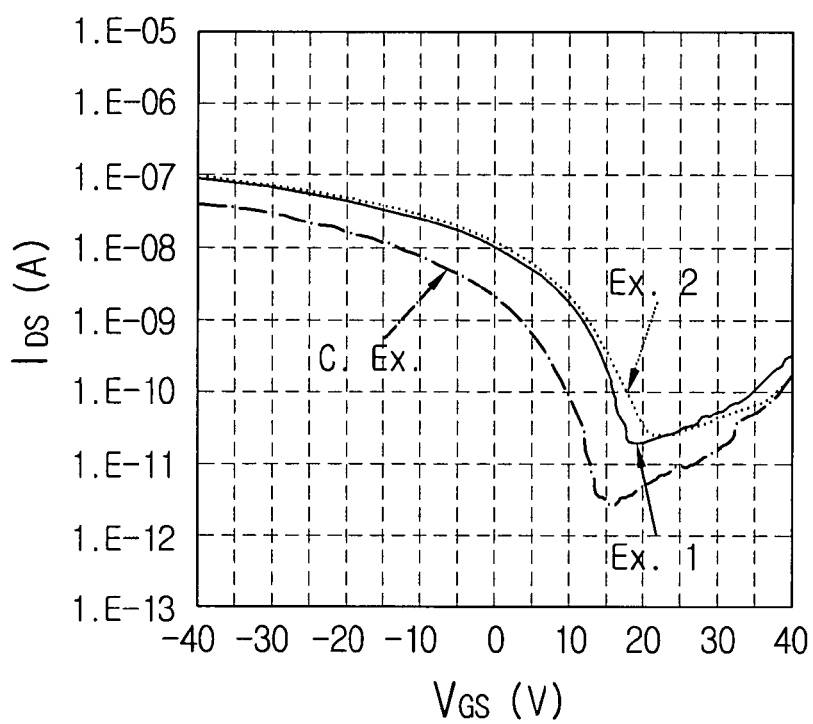

As is apparent from FIG. 4, in the case of the OTFTs of Examples 1 and 2, the amount of current in the on-state was drastically increased, compared to the OTFT of Comparative Example, and thus the charge mobility was improved.

In addition, the charge mobility of OTFTs manufactured in Examples 1 and 2 and Comparative Example was measured. The results are shown in Table 1 below.

As such, the charge mobility was calculated using the following current equation for the saturation region. That is, the current equation for the saturation region was converted into a graph of $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

-continued $$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, $\mu$ or $\mu_{FET}$ is charge mobility, $C_o$ is oxide film capacitance, W is the channel width, L is the channel length, $V_G$ is the gate voltage, and $V_T$ is the threshold voltage.

TABLE 1

| No. | Charge Mobility (cm²/Vs) | $I_{on}$ (A) |
| --- | --- | --- |
| Ex. 1 | 0.005 | 8.76e−8 |
| Ex. 2 | 0.004 | 8.94e−8 |
| C. Ex. | 0.003 | 4.12e−8 |

As is apparent from Table 1, in the OTFTs of Examples 1 and 2, manufactured using the organic semiconductor composition of example embodiments, current in on-state was increased about 1.5~3 times and thus charge mobility was increased about 1.3~1.7 times to thereby result in improved electrical properties, compared to the OTFT of Comparative Example.

As described hereinbefore, example embodiments provide an organic semiconductor composition including oligomer compounds, a composition for patterning an organic semiconductor layer including the same, an organic semiconductor thin film using the same, and an organic electronic device employing the thin film. According to example embodiments, an organic semiconductor composition may undergo a solution process and has a distribution of low-molecular-weight oligomer compounds in the spaces of a polymer compound to thus increase π-π stacking effects, resulting in intermolecular ordering and packing density. Using such a composition, a semiconductor thin film and an organic electronic device having improved electrical properties, e.g., increased charge mobility, may be manufactured.

Although example embodiments have been disclosed for illustrative purposes, those skilled in the art will appreciate that various modifications, additions and substitutions are possible, without departing from the scope and spirit of the accompanying claims.

What is claimed is:

1. An organic semiconductor composition, comprising a polymer compound represented by Formula 1 below and one or more oligomer compounds selected from the group consisting of compounds represented by Formulas 2 to 4 below:

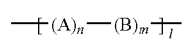

Formula 1 wherein A and B are each independently a substituted or unsubstituted $C_{6-30}$ aryl group or a substituted or unsubstituted $C_{2-30}$ heteroaryl group, and n and m are each independently an integer from about 0 to about 20 (n+m≠0), and l is an integer from about 10 to about 100,000; and $(A)_o$      Formula 2

$(B)_o$      Formula 3

$(A-B)_p$      Formula 4 in Formulas 2 to 4, A and B are each independently a substituted or unsubstituted $C_{6-30}$ aryl group or a substituted or unsubstituted $C_{2-30}$ heteroaryl group, and o is an integer from about 4 to about 12, and p is an integer from about 2 to about 6, wherein a molar ratio of the polymer compound represented by Formula 1 to the oligomer compound selected from the group consisting of compounds represented by Formula 2 to 4 is about 1000:1 to about 10:1.

2. The composition as set forth in claim 1, wherein a substituent in the substituted aryl group or heteroaryl group includes one or more selected from the group consisting of hydrogen, a hydroxyl group, halogen, a $C_{1-30}$ alkyl group, a $C_{6-30}$ aryl group, a $C_{2-30}$ heteroaryl group, a hydroxyalkyl group, a nitro group, a cyano group, a $C_{1-30}$ alkenyl group, a $C_{1-30}$ alkynyl group, a $C_{1-30}$ alkoxy group, a $C_{1-30}$ alkoxyalkyl group, a $C_{6-30}$ arylalkyl group, and a $C_{5-30}$ cycloalkyl group.

3. The composition as set forth in claim 1, wherein the aryl group or heteroaryl group is selected from the group consisting of compounds represented by Formulas 5 and 6 below:

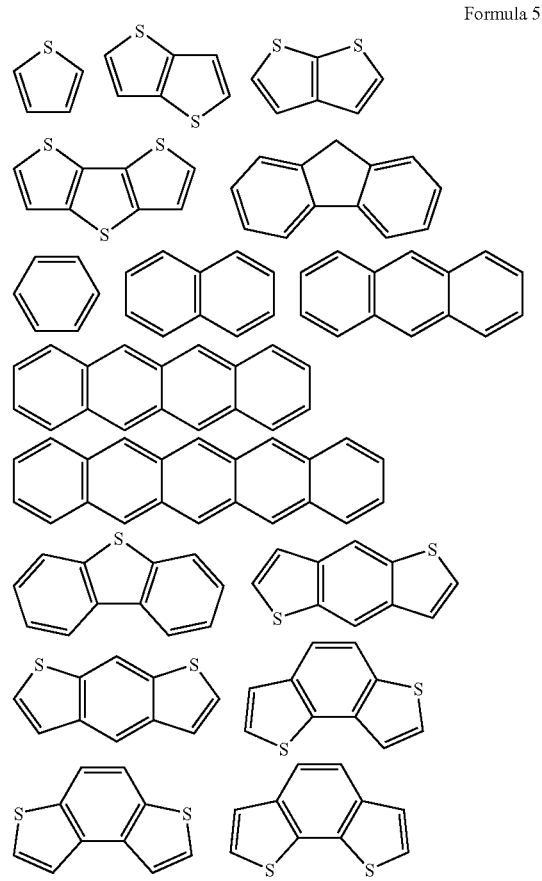

Formula 5

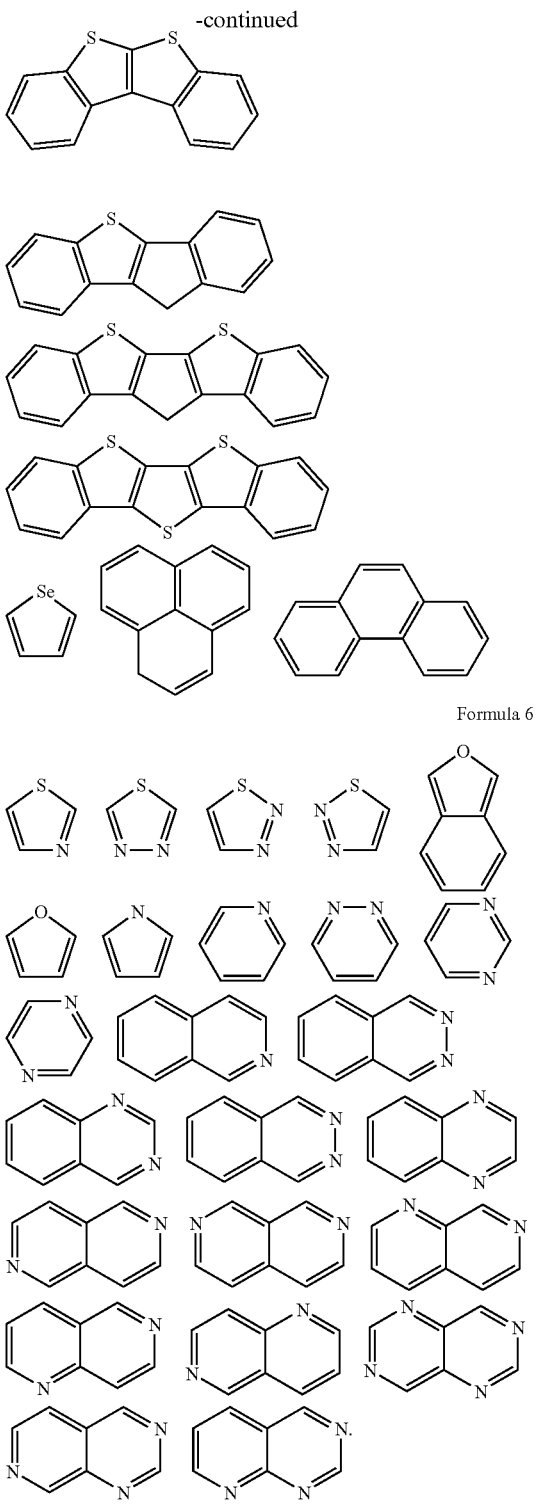

Formula 6

4. The composition as set forth in claim 1, wherein the polymer compound represented by Formula 1 has a weight average molecular weight from about 100 to about 1,000,000.

5. The composition as set forth in claim 1, wherein the oligomer compound represented by Formulas 2 to 4 has a weight average molecular weight from about 50 to about 1,000.

6. The composition as set forth in claim 1, wherein the polymer compound represented by Formula 1 is a π-conjugated copolymer.

7. The composition as set forth in claim 6, wherein the π-conjugated copolymer is selected from the group consisting of polypyrrole, polythiophene, polyselenophene, polyisothianaphthene, poly(arylene vinylene), polyaniline, polyazulene, polypyrene, polycarbazole, polyfuran, polyphenylene, polyindole, polypyridazine, polyacene, and derivatives thereof.

8. A composition for patterning an organic semiconductor layer, comprising the organic semiconductor composition of claim 1 and an organic solvent.

9. The composition as set forth in claim 8, wherein the organic solvent includes one or more selected from the group consisting of alcohols, including methylalcohol, ethylalcohol, n-propyl alcohol, isopropyl alcohol, n-butyl alcohol, sec-butyl alcohol, t-butyl alcohol, isobutyl alcohol, and diacetone alcohol, ketones, including acetone, methylethylketone, and methylisobutylketone, glycols, including ethyleneglycol, diethyleneglycol, triethyleneglycol, propyleneglycol, butyleneglycol, hexyleneglycol, 1,3-propanediol, 1,4-butanediol, 1,2,4-butanetriol, 1,5-pentanediol, 1,2-hexanediol, and 1,6-hexanediol, glycol ethers, including ethyleneglycol monomethyl ether and triethyleneglycol monoethyl ether, glycol ether acetates, including propyleneglycol monomethyl ether acetate (PGMEA), acetates, including ethyl acetate, butoxyethoxy ethyl acetate, butyl carbitol acetate (BCA) and dihydroterpineol acetate (DHTA), terpineols, trimethyl pentanediol monoisobutyrate (TEXANOL), dichioroethene (DCE), chlorobenzene, and N-methyl-2-pyrrolidone (NMP).

10. The composition as set forth in claim 8, including about 0.1 wt %~about 10 wt % of the organic semiconductor composition and about 90 wt %~about 99.9 wt % of the organic solvent.

11. An organic semiconductor thin film, formed using the composition for patterning an organic semiconductor layer of claim 8.

12. The organic semiconductor thin film as set forth in claim 11, wherein the organic semiconductor thin film is formed using a coating process selected from the group consisting of spin coating, dip coating, roll coating, screen coating, spray coating, spin casting, flow coating, screen printing, ink jetting, and drop casting.

13. An organic electronic device, comprising the organic semiconductor thin film of claim 11.

14. The organic electronic device as set forth in claim 13, wherein the organic electronic device is selected from the group consisting of thin film transistors, field emission devices, solar cells, and memory.

* * * * *